United States Patent
Tai et al.

(10) Patent No.: US 11,664,393 B2
(45) Date of Patent: May 30, 2023

(54) METHOD OF MANUFACTURING AN ELECTRONIC DEVICE

(71) Applicant: Innolux Corporation, Miao-Li County (TW)

(72) Inventors: Ming-Jou Tai, Miao-Li County (TW); Chia-Hao Tsai, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 93 days.

(21) Appl. No.: 17/202,371

(22) Filed: Mar. 16, 2021

(65) Prior Publication Data
US 2021/0305288 A1 Sep. 30, 2021

(30) Foreign Application Priority Data
Mar. 31, 2020 (CN) .......................... 202010242641.3

(51) Int. Cl.
*H01L 27/12* (2006.01)
*H01L 29/786* (2006.01)

(52) U.S. Cl.
CPC ...... *H01L 27/1288* (2013.01); *H01L 27/1248* (2013.01); *H01L 29/78633* (2013.01)

(58) Field of Classification Search
CPC ............. H01L 27/1248; H01L 27/1288; H01L 27/14621; H01L 27/124; H01L 27/3334; H01L 29/78633; H01L 29/41733; H01L 29/78672; H01L 29/7839; H01L 29/42384
See application file for complete search history.

(56) References Cited

U.S. PATENT DOCUMENTS 10,712,594 B2 * 7/2020 Cho ................... G02F 1/136227
2018/0329248 A1 * 11/2018 Cho ..................... G02F 1/13318

FOREIGN PATENT DOCUMENTS

CN 108231833 6/2018

* cited by examiner

*Primary Examiner* — Nikolay K Yushin
(74) *Attorney, Agent, or Firm* — JCIPRNET

(57) ABSTRACT

The present disclosure provides a method for manufacturing an electronic device, and the method comprises providing a substrate and forming a pattern layer. The substrate has a step structure, and the step structure comprises a high-level surface and a low-level surface. The pattern layer is formed on the high-level surface and the low-level surface, wherein the pattern layer is made by at least two photolithography processes. The disclosure also provides an electronic device manufactured by the manufacturing method of the disclosed embodiment in the disclosure.

19 Claims, 12 Drawing Sheets

METHOD OF MANUFACTURING AN ELECTRONIC DEVICE

CROSS-REFERENCE TO RELATED APPLICATION

This application claims the priority benefit of China application serial no. 202010242641.3, filed on Mar. 31, 2020. The entirety of the above-mentioned patent application is hereby incorporated by reference herein and made a part of this specification.

BACKGROUND

Technical Field

The present disclosure relates to a method of manufacturing an electronic device.

Description of Related Art

With the advancement of modern technology, the application of various electronic devices has become more and more extensive. How to improve process yield or mass production under the existing design is an important issue.

SUMMARY

According to an embodiment of the present disclosure, a method of manufacturing an electronic device includes providing a substrate and forming a pattern layer. The substrate with a step structure comprising a high-level surface and a low-level surface. The pattern layer is formed on the high-level surface and the low-level surface, wherein the pattern layer is formed by at least two photolithography processes.

According to an embodiment of the present disclosure, an electronic device comprises a substrate and a unit pattern. The substrate with a step structure comprising a high-level surface, a low-level surface, and a taper between the high-level surface and the low-level surface. The unit pattern has a first portion on the high-level surface, a second portion on the taper, and a third portion on the low-level surface. A width of the second portion is less than a width of the first portion.

According to an embodiment of the present disclosure, an electronic device includes a substrate and a pattern layer. The substrate with a step structure comprising a high-level surface and a low-level surface. The pattern layer comprises a first unit pattern, a second unit pattern adjacent to the first unit pattern, and a third unit pattern adjacent to the second unit pattern. The second unit pattern is located between the first unit pattern and the third unit pattern. Each of the first unit pattern, the second unit pattern, and the third unit pattern extends from the low-level surface to the high-level surface. A distance between the first unit pattern and the second unit pattern is different from a distance between the second unit pattern and the third unit pattern.

BRIEF DESCRIPTION OF THE DRAWINGS

Drawings are included for further understanding of this disclosure, and the drawings are incorporated into and constitute a part of this specification. The drawings illustrate the embodiments of the present disclosure and together with the description are used to explain the principles of the present disclosure.

DESCRIPTION OF THE EMBODIMENTS

Figure 1:
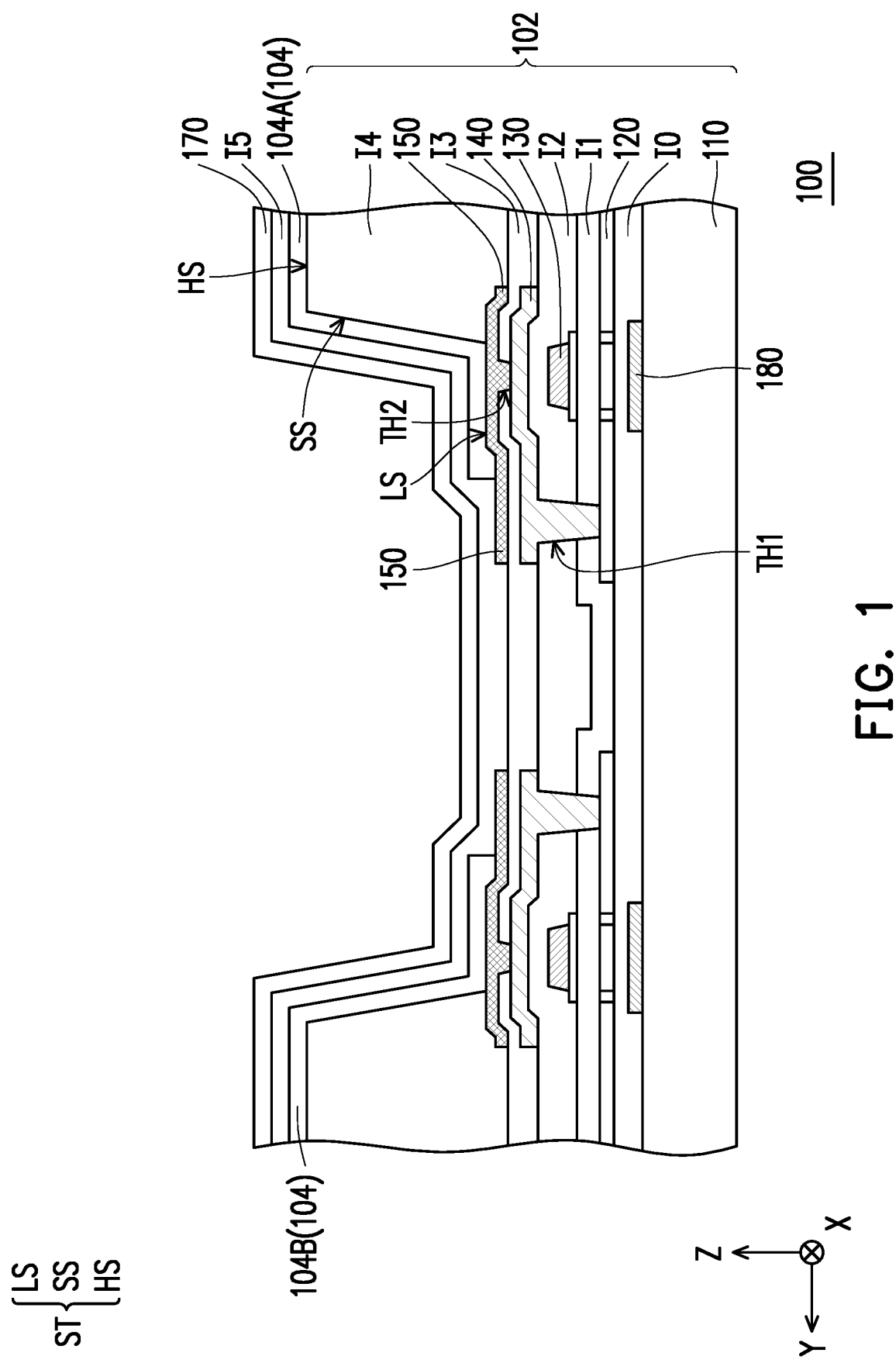
FIG. 1 is a schematic partial cross-sectional view of an electronic device according to an embodiment.

The description in the disclosure that a structure (or layer, component, substrate) is located above another structure (or layer, component, substrate) may refer to the two structures being adjacent and directly connected (or in contact), or refer to two structures adjacent to each other without being directly connected (or contacted). The indirect connection means that there is at least one intermediate structure (or intermediate layer, intermediate component, intermediate substrate, intermediate space) between the two structures, and The lower surface of one structure is adjacent or directly connected to the upper surface of the intermediate structure, and the upper surface of another structure is adjacent or directly connected (or in contact) to the lower surface of the intermediate structure, and the intermediate structure may be a single layer, a multi-layer structure or non-physical structure, which formed no limitation to the disclosure. In this disclosure, when a structure is placed "on" another structure, it may mean that the structure is "directly" on the another structure, or that the structure is "indirectly" on the another structure, that is, at least one further structure may be sandwiched between the structure and the another structure.

Electrical connection or coupling as described in the disclosure may both refer to direct connection or indirect connection. In the case of direct connection, the terminal points of two components on the circuit are directly connected or are connected to each other via a conductor line segment. In the case of indirect connection, a switch, a diode, a capacitor, an inductor, a resistor, another suitable component, or a combination of the above components is present between the terminal points of two components on the circuit. However, the disclosure is not limited thereto.

The present disclosure can be understood by referring to the following detailed description in conjunction with the accompanying drawings. It should be noted that, in order to make it easy for the reader to understand and the simplicity of the drawings, multiple drawings in this disclosure only depict a part of the electronic device, and the specific components in the drawings are not drawn according to actual scale. In addition, the number and size of each component in the drawings are only for illustration, not for limiting the scope of the disclosure.

In the disclosure, the thickness, length, or width may be measured by an optical microscope, and the thickness may be measured according to a cross-sectional image in an electron microscope, but the disclosure is not limited thereto. In addition, there may be a certain error between any two values or directions used for comparison. If a first value is equal to a second value, it is implied that there may be an error of about 10% between the first value and the second value; if a first direction is perpendicular to a second direction, the angle between the first direction and the second direction may be 80 degrees to 100 degrees; and if the first direction is parallel to the second direction, the angle between the first direction and the second direction may be 0 degrees to 10 degrees.

Throughout this disclosure, the entire specification and claims will use certain terms to refer to specific components. Those skilled in the art should understand that the electronic device manufacturers may refer to the same component by different names. This article does not intend to distinguish between components with the same function but different names. In the following description and claims, the terms "contain" and "include" are open-ended terms, so they should be interpreted as meaning "contained but not limited to . . . ".

The "first", "second", etc., in the specification of the disclosure may be used herein to describe various components, members, regions, layers, and/or parts, but these components, members, regions, and/or parts should not be limited by these terms. These terms are used to distinguish one component, member, region, layer, or part from another component, member, region, layer, or part. Thus, "first component", "member", "region", "layer", or "part" discussed below is used to distinguish from "second component", "member", "region", "layer", or "part" and not to limit a sequence or a particular component, member, region, layer, and/or part.

Reference will now be made in detail to the exemplary embodiments of the present disclosure, examples of which are illustrated in the drawings. Identical component symbols are used to indicate the same or similar parts in the drawings and description.

Please refer to FIG. 1, which is a schematic partial cross-sectional view of an electronic device according to an embodiment of the disclosure. An electronic device 100 includes a substrate 102 (such as an array substrate) and a pattern layer 104 disposed (or formed) on the substrate 102. In FIG. 1, the electronic device 100 includes a base 110, a shielding layer 180, a semiconductor layer 120, a first metal layer 130, a second metal layer 140, a third metal layer 150, a pattern layer 104, a common electrode layer 170 or other suitable layers, but the disclosure is not limited to this. In addition, the electronic device 100 also includes multiple insulating layers I0 to I5.

In some embodiments, the shielding layer 180 is disposed on the base 110, and the insulating layer I0 is disposed on the shielding layer 180. The material of the base 110 includes, but not limited to, glass, quartz, sapphire, ceramic, polycarbonate (PC), polyimide (PI), polyethylene terephthalate (PET), rubber, glass fiber, other suitable substrate materials, or a combination of the foregoing. The shielding layer 180 includes a light-shielding material, such as a metal material or a photoresist material, but the disclosure is not limited thereto. The semiconductor layer 120 is disposed on the insulating layer I0. In the normal direction Z of the base 110, the shielding layer 180 overlaps a portion of the semiconductor layer 120. The shielding layer 180 can be used to shield light irradiating the semiconductor layer 120 from the bottom surface of the base 110. The material of the semiconductor layer 120 includes crystalline silicon, polycrystalline silicon, amorphous silicon, oxide semiconductor materials, organic semiconductor materials, other suitable materials, or a combination thereof. In some embodiments, the insulating layer I1 is disposed on the semiconductor layer 120, and the first metal layer 130 is disposed on the insulating layer I1 (e.g., gate insulating layer). In the normal direction Z of the base 110, a portion of the first metal layer 130 (for example, the gate) overlaps the semiconductor layer 120, and the portion of the semiconductor layer 120 overlapping the gate may be defined as a channel region, semiconductors on opposite sides of the channel region may respectively be used as the source region and drain region. The insulating layer I2 is disposed on the first metal layer 130, and the second metal layer 140 is disposed on the insulating layer I2. In some embodiments, the insulating layer I1 and/or the insulating layer I2 form a through hole TH1, and the second metal layer 140 (e.g., drain) is electrically connected to the semiconductor layer 120 (e.g., drain region) through the through hole TH1, but the disclosure is not limited to this. The second metal layer 140 may include a data line (not shown), and the data line may be electrically connected to the source region of the semiconductor layer 120, but is not limited thereto. The insulating layer I3 is disposed on the second metal layer 140, the third metal layer 150 is disposed on the insulating layer I3, the insulating layer I3 forms, a through hole TH2, and the third metal layer 150 is electrically connected to the second metal layer 140 through the through hole TH2, but the disclosure is not limited to this. The insulating layer I4 is disposed on the third metal layer 150, and the pattern layer 104 is disposed on the insulating layer I4. In some embodiments, the material of the insulating layer I4 includes an organic insulating material or an inorganic insulating material, but is not limited thereto. In some embodiments, the insulating layer I4 may include a single-layer structure or a multi-layer structure, but is not limited thereto. In some embodiments, the insulating layer I4 has an opening which may expose a portion of the third metal layer 150 and/or a portion of the insulating layer (e.g., the insulating layer I3). In this embodiment, the base 110, the shielding layer 180, the semiconductor layer 120, the first metal layer 130, the second metal layer 140, the third metal layer 150 and/or the insulating layers I0~I4 constitute, a substrate with an active device array 102, but not limited to this. One or more of the above-mentioned layers included in the substrate 102 may be removed or one or more further layers may be added in the substrate 102 as required. In some embodiments, the thickness of the insulating layer I4 is greater than the thickness of anyone of the insulating layer I0 to the insulating layer I3, and the insulating layer I4 may be designed to have an opening, the substrate 102 has a step structure ST. For example, the step structure ST may include a high-level surface HS and a low-level surface LS. The substrate comprises a base 102, and an insulating layer (such the insulating layer I4) disposed on the base 102 to form the step structure. The high-level surface HS may be the top surface of the insulating layer I4, and the low-level surface LS may be the surface of the film layer exposed in the opening of the insulating layer I4. The low-level surface LS may include the exposed upper surface of the third metal layer 150 and/or the exposed upper surface of the insulating layer I3, but is not limited thereto. In some embodiments, in the cross section, the width of the opening at the portion adjacent to the base 110 may be narrower than the width of the opening at the portion away from the base 110, but is not limited thereto. In other embodiments (not shown), in the cross-section, the width of the opening at the portion adjacent to the base 110 may be approximately equal to the width of the opening at the portion away from the base 110.

In some embodiments (as shown in FIG. 1), the step structure ST may include a taper SS between the high-level surface HS and the low-level surface LS. The taper SS may be the side wall of the insulating layer I4. In some embodiments, the height difference between the high-level surface HS and the low-level surface LS may be 1 micrometer (um) to 5 micrometers (1 micrometer≤height difference≤5 micrometers), 2 micrometers to 5 micrometers (2 micrometer≤height difference≤5 micrometers), 2 micrometers to 3 micrometers (2 microns≤height difference≤3 micrometers), 3 micrometers to 4 micrometers (3 micrometers≤height difference≤4 micrometers), but not limited to this. In some embodiments (not shown), in the cross-section, the taper SS has an arc-shaped surface.

Please refer to FIG. 1. In some embodiments, the pattern layer 104 may be disposed or formed on the high-level surface HS and the low-level surface LS, and the pattern layer 104 may include a first unit pattern 104A and a second unit pattern 104B. In some embodiments, the first unit pattern 104A and the second unit pattern 104B may be located on opposite sides of the opening and physically separated from or electrically insulated from each other. In some embodiments, in the normal direction Z of the base 110, the first unit pattern 104A and the second unit pattern 104B may overlap a part of the high-level surface HS, a taper SS, and a part of the low-level surface LS. In other words, the first unit pattern 104A and the second unit pattern 104B may extend from part of the high-level surface HS to part of the low-level surface LS, and the first unit pattern 104A and the second unit pattern 104B may be electrically connected or contact with the third metal layer 150 exposed by different openings. In some embodiments, the material of the pattern layer 104 may include a transparent conductive material, such as indium tin oxide, indium zinc oxide, indium oxide, tin oxide, other suitable materials, or a combination thereof, but is not limited thereto. In some embodiments, the first unit pattern 104A and the second unit pattern 104B may serve as pixel electrodes. In other word, the pattern layer is a pixel electrode layer. In some embodiments, the insulating layer I5 may be disposed on the pattern layer 104, and the common electrode layer 170 is disposed on the insulating layer I5, but it is not limited thereto. In other embodiments, the common electrode layer 170 may be disposed between the pattern layer 104 (including the first unit pattern 104A and the second unit pattern 104B) and the base 110, as will be further described in FIG. 15. In some embodiments, the material of the common electrode layer 170 includes a transparent conductive material, such as indium tin oxide, indium zinc oxide, indium oxide, tin oxide, other suitable materials, or a combination thereof, but is not limited thereto. In some embodiments, the materials of the common electrode layer 170, the first unit pattern 104A and the second unit pattern 104B may be the same or different.

In FIG. 1, the electronic device 100 includes a substrate 102 having a step structure ST and a pattern layer 104, and the pattern layer 104 may be formed by at least two photolithography processes. In some embodiments, in the normal direction Z (or top-view direction) of the base 110, the pattern layer 104 may include a plurality of unit patterns (e.g., the first unit pattern 104A and the second unit pattern 104B adjacent to the first unit pattern 104A), and the plurality of unit patterns may be used as multiple pixel electrodes. In some embodiments, the unit patterns may be arranged in an array or other arrangements. In some embodiments, the unit patterns may be separated and electrically insulated from each other. In some embodiments, in the normal direction Z of the base 110, a gap may be between adjacent unit patterns, and the gap is used to separate adjacent unit patterns. In this embodiment, the pattern layer 104 may be formed by at least two photolithography processes.

FIG. 2 to FIG. 6 are schematic diagrams showing steps of forming a pattern layer in a method of manufacturing an electronic device according to an embodiment of the disclosure. In this embodiment, the cross-sectional structure of the substrate 102 (for example, having a step structure ST) may be as described in the foregoing embodiment, and will not be repeated.

Figures 2, 3:
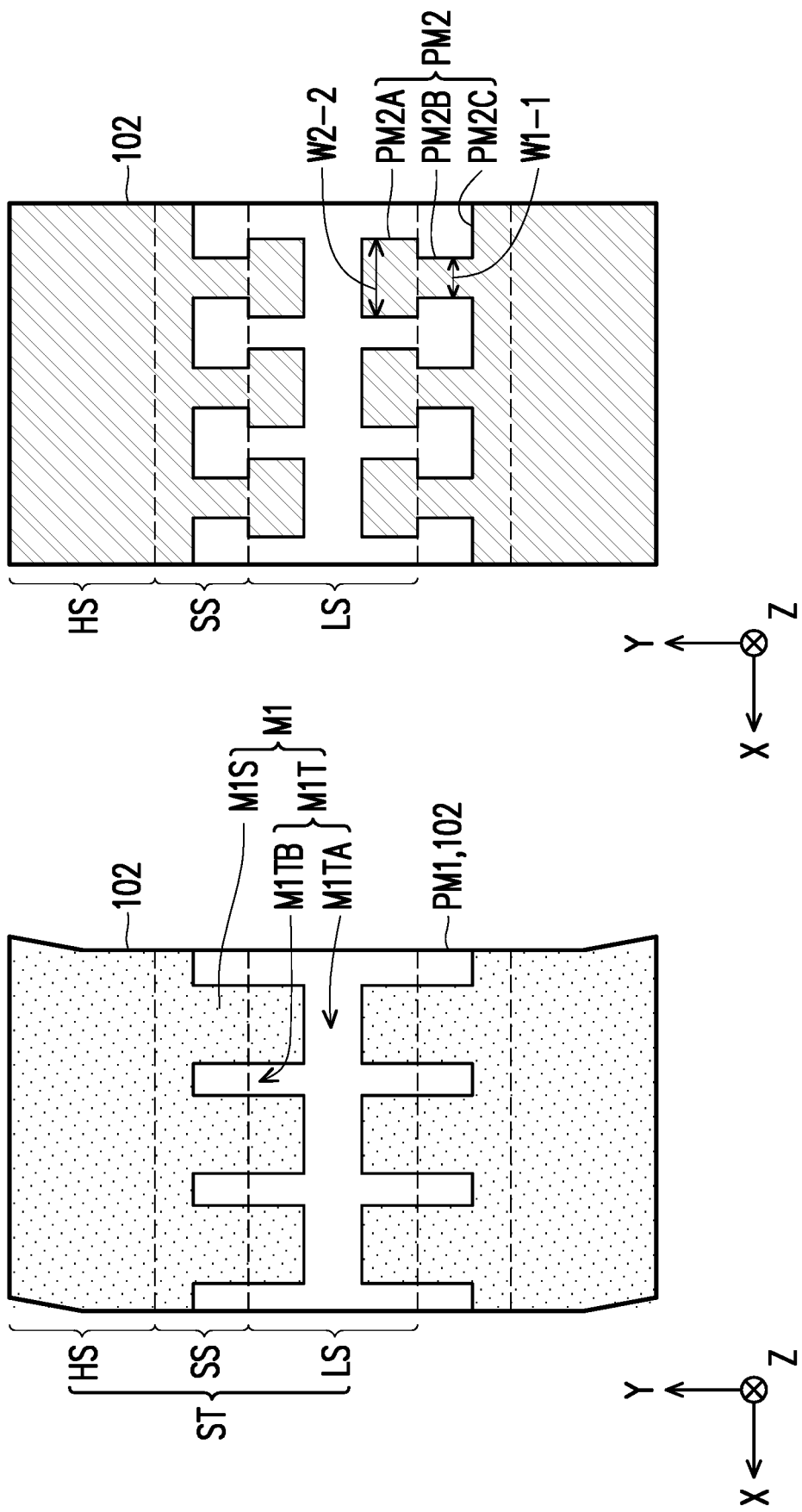
FIGS. 2 to 6 are schematic diagrams of steps for forming a pattern layer in a method of manufacturing an electronic device according to an embodiment.

Please refer to FIG. 2, which shows that the photomask M1 is positioned above the substrate 102, and a pattern material layer PM1 is formed or disposed on the substrate 102. The pattern material layer PM1 is formed on the substrate 102 in conformity with the step structure ST of the substrate 102, and a photoresist material (not shown) is disposed on the pattern material layer PM1. After placing the photomask M1 above the photoresist material, a photolithography and etching process is performed to pattern the pattern material layer PM1.

The photomask M1 may have light-shielding patterns M1S and a light-transmitting pattern M1T. The light-transmitting pattern M1T is located between the two light-shielding patterns M1S. In some embodiments, the light transmitting pattern M1T includes a trunk M1TA and a plurality of branches M1TB. In the normal direction Z of the base 110, the trunk M1TA of the light-transmitting pattern M1T may be placed overlapping the low-level surface LS of the step structure ST, and the branch M1TB of the light-transmitting pattern M1T may extend from the trunk M1TA toward the high-level surface HS, while the branch M1TB may overlap the low-level surface LS and the taper SS of the step structure ST without overlapping the high-level surface HS, but the disclosure is not limited to this.

In general, under the same exposure conditions (such as equal exposure), the portion of photoresist material on the low-level surface LS may subject to a smaller amount of exposure than the portion of the photoresist material on the taper SS or the high-level surface HS. If the exposure conditions are set so that the portion on the low-level surface LS receives sufficient exposure, the portion on the taper SS or the high-level surface HS may subject to more exposure energy than expected, which causes the portion of the photoresist material on the taper SS or the high-level surface HS to be over-removed than expected. Therefore, the pattern layer 104 disclosed in the present disclosure may be fabricated by at least two photolithography processes, which helps to overcome the above-mentioned problems. In detail, the pattern material layer PM1 may be firstly formed on the substrate 102 using a deposition process, and then a photoresist material (not shown) may be disposed on the pattern material layer PM1. Next, a photoresist pattern (not shown) is defined using the photomask M1, where the area of the light-shielding pattern M1S of the photomask M1 may substantially correspond to the area of the photoresist pattern. Next, the pattern material layer PM1 may be etched to pattern the pattern material layer PM1 into a pre-pattern PM2, where the pattern material layer PM1 covered by the photoresist pattern (not shown) may be not etched. In other words, as shown in FIGS. 2 and 3, the portion of the pattern material layer PM1 corresponding to the light-transmitting pattern M1T is removed, and the portion corresponding to the light-transmitting pattern M1T on the taper SS may be removed with a more amount than the portion on the low-level surface LS. Therefore, as shown in FIG. 3, FIG. 3 shows the case of the pre-pattern PM2 after the photolithography and etching process described above. The pre-pattern PM2 may include a portion PM2A located on the low-level surface LS, a connection portion PM2B located on the taper SS, and a portion PM2C on the high-level surface HS. In some embodiments (see FIG. 3), the contour of the portion PM2A and the contour of the connection portion PM2B may be formed corresponding to the branch M1TB of the light-transmitting pattern M1T. However, as described above, the photoresist pattern on the taper SS may receive more amount of exposure than the photoresist pattern on the low-level surface LS, the width W1-1 of the connection portion PM2B on the taper SS that is formed by the subsequent etching process may be smaller than the width W2-2 of the portion PM2A on the low-level surface LS, but the disclosure is not limited to this. The width W1-1 may be defined as the maximum width of the central region of the connection portion PM2B in the first direction X, and the width W2-2 may be defined as the maximum width of the central region of the corresponding portion PM2A in the first direction X.

Figure 5:
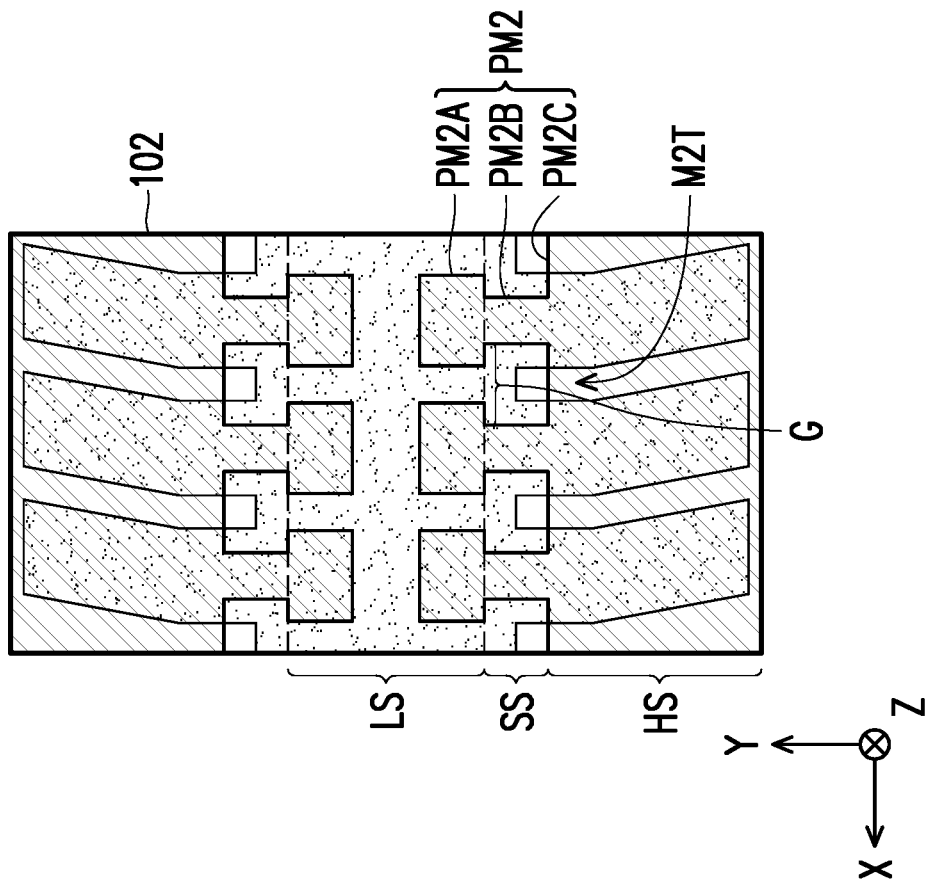
Figure 4:
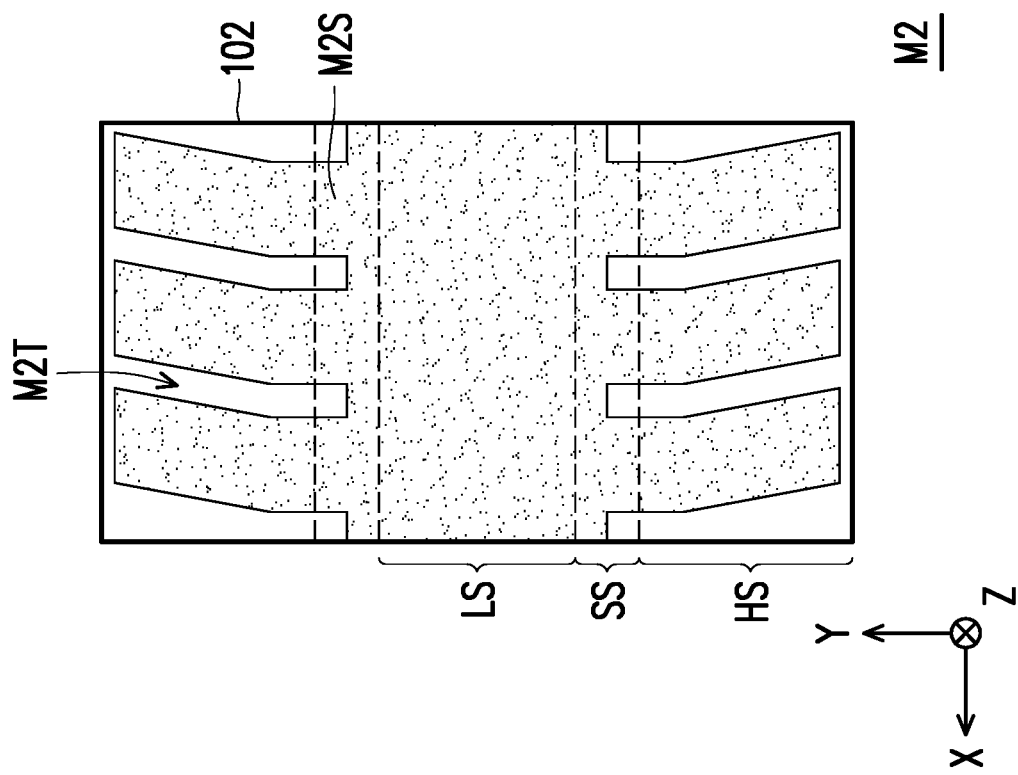

Next, another photolithography process may be performed using the photomask M2 of FIG. 4 to pattern the pre-pattern PM2 of FIG. 3. FIG. 5 shows that the photomask M2 may be provided on the substrate 102 on which the pre-pattern PM2 is formed. In FIG. 4, the photomask M2 may include a light-shielding pattern M2S and a light-transmitting pattern M2T. In the normal direction Z of the base 110, the light-shielding pattern M2S may overlap the low-level surface LS, part of the taper SS, and part of the high-level surface HS, but the light-transmitting pattern M2T does not overlap the low-level surface LS. However, the disclosure is not limited to this. In some embodiments, the light-transmitting pattern M2T may extend from the high-level surface HS to a part of the taper SS, and does not extend to the low-level surface LS, but is not limited thereto. As shown in FIG. 5, in the normal direction Z of the base 110, the light-transmitting pattern M2T may overlap the gap G between two adjacent connection portions PM2B of the pre-pattern PM2, that is, the light-transmitting pattern M2T may separate the connection portions PM2B of the pre-pattern PM2. In some embodiments, in the normal direction Z of the base 110, the light-shielding pattern M2S may be overlapped with the portion PM2A and the connection portion PM2B of the pre-pattern PM2. In some embodiments, in the normal direction Z of the base 110, the light-transmitting portion M2T may overlap the portion PM2C on the high-level surface HS, and may expose the portion PM2C. In some embodiments, after performing the photolithography process and the patterning process through the above-mentioned photomask M2, the pre-pattern PM2 may be further patterned into a plurality of unit patterns 204A shown in FIG. 6 to complete the formation of the pattern layer 204, but the disclosure is not limited thereto. It should be noted that the above photolithography process and patterning process are only examples, and can be adjusted appropriately according to the needs. It should be noted that the above mask pattern is only an example, and can be adjusted according to the needs.

Figure 6:
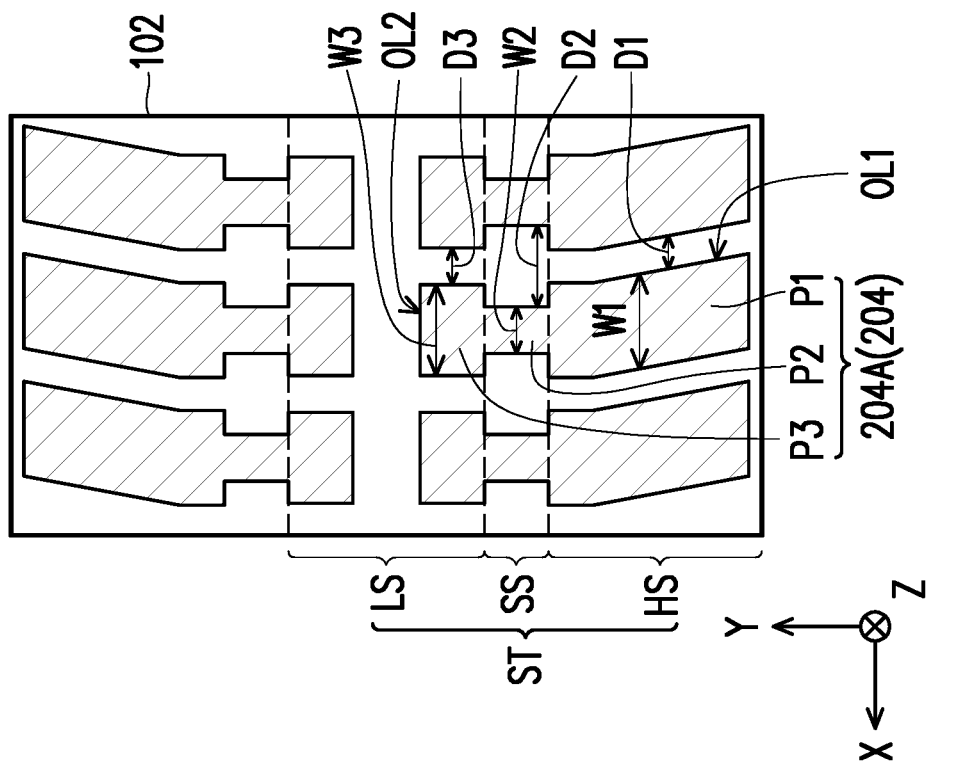

Please refer to FIG. 6, which illustrates the pattern layer 204 formed by the steps of FIGS. 2 to 5. As shown in FIG. 6, the pattern layer 204 can be regarded as an embodiment of the pattern layer 104 in FIG. 1. The pattern layer 204 may be disposed (or formed) on the substrate 102, and the substrate 102 with a step structure ST comprising a high-level surface HS, a low-level surface LS, and a taper SS between the high-level surface HS and the low-level surface LS. The pattern layer 204 may include a plurality of unit patterns 204A. The first contour OL1 of the unit pattern 104 at the high-level surface HS is formed by the photolithography process and the etching process through the photomask M2 of FIG. 4. The second contour OL2 of the unit pattern 104 at the low-level surface LS may be formed by the photolithography process and the etching process through the photomask M1 of FIG. 2 different from the photomask M2. In other words, the first contour OL1 of the unit pattern 104 at the high-level surface HS and the second contour OL2 of the unit pattern 104 at the low-level surface LS may be formed by different photolithography processes. Referring to FIG. 6 and FIG. 1 at the same time, each unit pattern 204A of the pattern layer 204 may include a first portion P1 on the high-level surface HS, a second portion P2 on the taper surface SS, and a third portion P3 on the low-level surface LS. According to the foregoing manufacturing steps, the first portion P1 may be patterned using the photomask M2 of FIG. 4, and the second portion P2 and the third portion P3 are patterned using the photomask M1 of FIG. 2, but it is not limited to this. In some embodiments, the unit pattern 204A may have a non-equal width, and the width W2 of the second portion P2 may be less than the width W1 of the first portion P1, the width W1 can be defined as a maximum width measured approximately corresponding to of the central region of the first portion P1 in the first direction X, and the width W2 can be defined as a maximum width measured approximately corresponding to of the central region of the second portion P2 in the first direction X. In some embodiments, the width W2 of the second portion P2 can be selectively less than or equal to the width W3 of the third portion P3, and the width W3 can be defined as the maximum width measured approximately corresponding to of the central region of the third portion P3 in the first direction X. In addition, the distance D1 between the first portions P1 of the two adjacent unit patterns 204A may be different from the distance D2 between the second portions P2 of the two adjacent unit patterns 204A. In some embodiments, the distance D2 may be selectively different from the distance D3 between the third portions P3 of the two adjacent unit patterns 204A. In other embodiments, the distance D1 and the distance D3 may be the same or different, the distance D1 may be less than or equal to the distance D3. The above distance D1 may be defined as the maximum distance between the central regions of the first portions P1 of two adjacent unit patterns 204A in the first direction X. The above-mentioned distance D2 can be defined as a maximum distance in the first direction X between the central regions of two adjacent unit patterns 204A corresponding to the second portion P2. The above distance D3 may be defined as a maximum distance between the central regions of the third portions P3 of the two adjacent unit patterns 204A in the first direction X. The first direction X can be defined as the arrangement direction of different unit patterns.

By way of the above example (steps in FIGS. 2 to 6), the first outline OL1 of the unit pattern 204A on the high-level surface HS and the second outline OL2 of the unit pattern 204A on the low-level surface LS can be close to or the same as an expected outline, which may reduce the disconnection problem caused by the unit pattern 204A being subjected to overexposure in some areas, or improve the production yield of the pattern layer 204, and thus is helpful for the application in high-resolution products.

It should be noted that the above steps of forming the pattern layers in FIGS. 2 to 6 are only examples. The photomask M2 as shown in FIG. 4 may be used for the photolithography process according to requirements prior to the photomask M1 as shown in FIG. 2 is used for photolithography process. The position where the photomask M2 and/or the photomask M1 may be placed above the step structure ST may be similar to that described in the foregoing embodiment, and will not be repeated. In addition, it should be noted that the patterns of the photomask M1 and/or the photomask M2 (such as the size, shape or corresponding position of the shading pattern) are only examples, but can be adjusted according to requirements.

Figure 7:
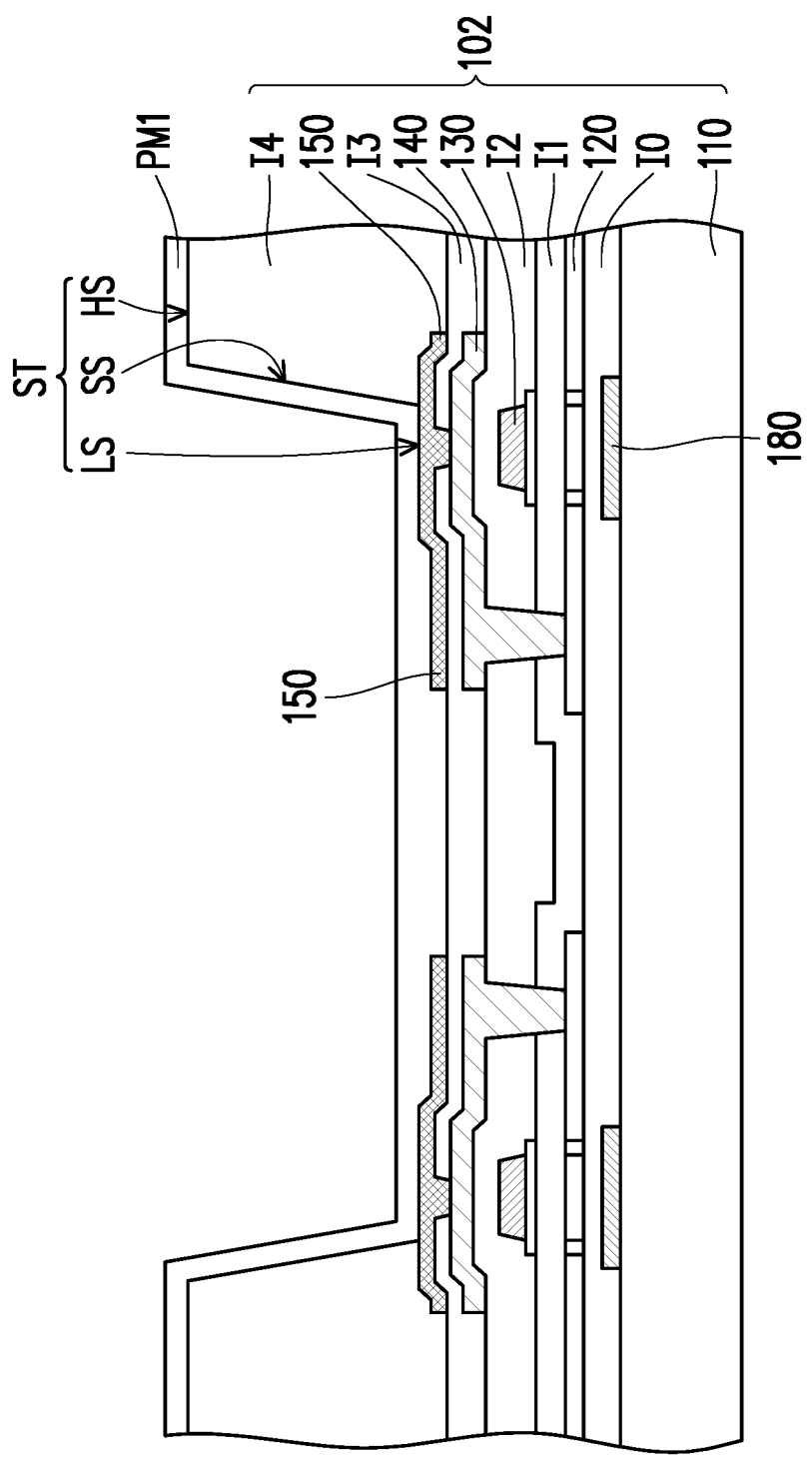
FIGS. 7 to 14 are schematic diagrams of steps for forming a pattern layer in a method of manufacturing an electronic device according to an embodiment.

FIGS. 7 to 14 are schematic diagrams illustrating steps of forming a pattern layer in a method of manufacturing an electronic device according to another embodiment. Please refer to FIG. 7. FIG. 7 shows that a pattern material layer PM1 in an embodiment of the present disclosure is disposed on the substrate 102. The pattern material layer PM1 may be formed by a deposition process, and the cross-sectional structure of the substrate 102, e.g., the substrate 102 with the step structure ST, can be as described in the previous embodiment, and will not be repeated.

Figure 8:
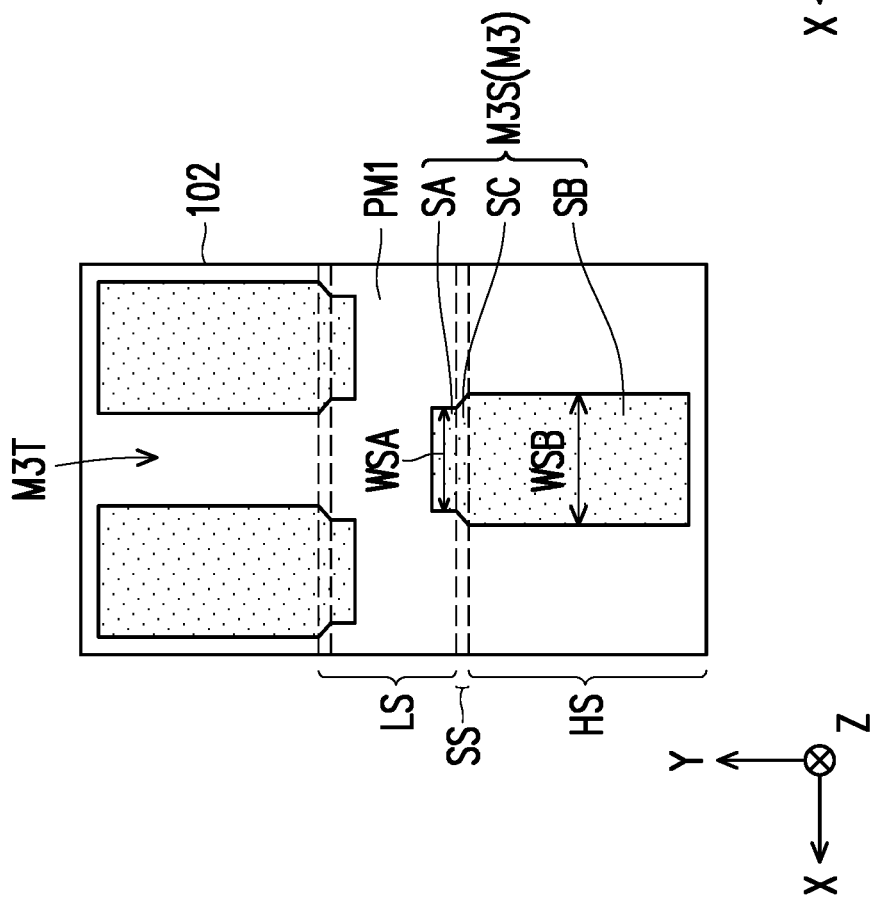

Please refer to FIG. 8. FIG. 8 illustrates a method for placing a photomask for patterning a pattern material layer on a substrate according to an embodiment of the present disclosure. Please refer to FIG. 8, the photomask M3 has a plurality of light-shielding patterns M3S and a light-transmitting pattern M3T, wherein FIG. 8 is described with three light-shielding patterns M3S arranged in two rows, but not limited thereto. In some embodiments, the light shielding pattern M3S in the first row (for example, the two light shielding patterns M3S in the upper row) and the light shielding pattern M3S in the second column (for example, the light shielding pattern M3S in the lower row) may be alternately arranged in the second direction Y (for example, the column direction) and not aligned with each other, where the second direction Y is substantially perpendicular to the first direction X. In some embodiments, in the normal direction Z of the base 110, the light shielding pattern M3S may overlap the high-level surface HS of the substrate 102, and the light shielding pattern M3S may overlap a part of the low-level surface LS of the substrate 102, but is not limited thereto. In some embodiments, the light shielding patterns M3S may have different widths. For example, the width WSA of the portion SA of the light shielding pattern M3S overlapping the low-level surface LS may be smaller, and the width WSB of the portion SB of the light shielding pattern M3S overlapping the high-level surface HS may be larger. In some embodiments, the light shielding pattern M3S may have a portion SC between the portion SA and the portion SB. The portion SC may overlap the taper SS. The width of the portion SC may be increased from a side connected to the portion SA to the side connected to the portion SB, but not limited thereto. The aforementioned width WSA and width WSB can be defined as the maximum width measured at the central area of the respect portion in the first direction X.

Figure 9:
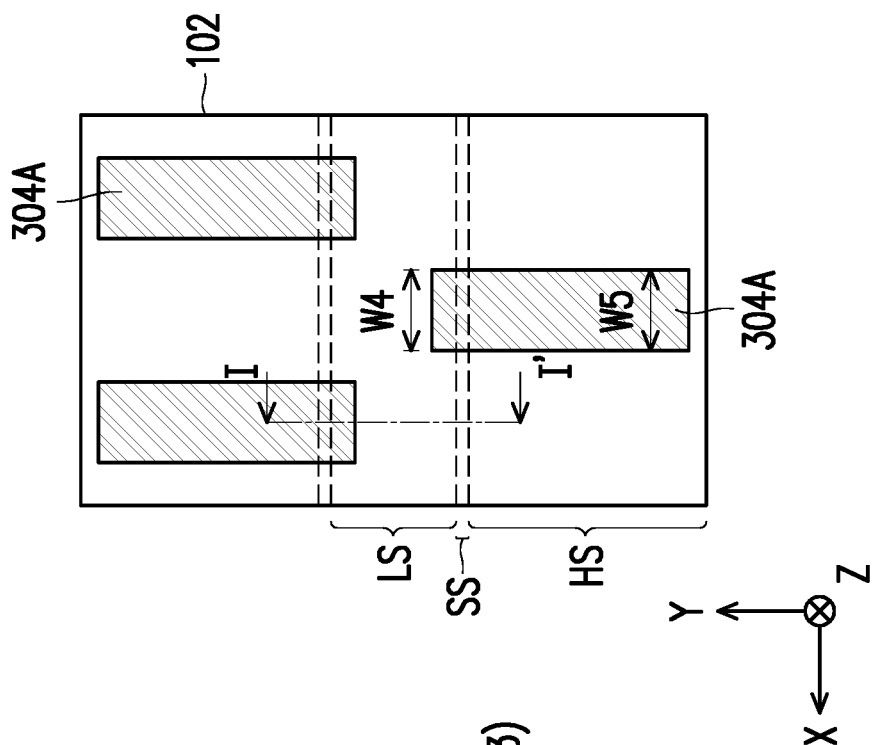

Please refer to FIG. 9, which shows a schematic top view of the unit pattern obtained after the pattern material layer is patterned. Referring to FIGS. 8 and 9, the photomask M3 may be used to perform a photolithography process to pattern the pattern material layer PM1 to form a plurality of unit patterns 304A. Specifically, the steps of the photolithography process include firstly forming a photoresist material layer (not shown) on the pattern material layer PM1, and then exposing the photoresist material layer (not shown) using the photomask M3 to form a photoresist pattern (not shown). Next, the pattern material layer PM1 may be etched, and the pattern material layer PM1 superimposed under the photoresist pattern is not etched to pattern the pattern material layer PM1. Therefore, the outline of the unit pattern 304A may roughly correspond to the outline of the photoresist pattern. For convenience of description, the outline of the unit pattern 304A is directly described below.

As shown in FIG. 9, a plurality of unit patterns 304A are arranged on both sides of the low-level surface LS of the substrate 102 in an alternating manner. For example, in the normal direction Z of the base 110, the plurality of unit patterns 304A may overlap a portion of the low-level surface LS, the taper SS and the high-level surface HS. The width W4 of one of the unit patterns 304A on the low-level surface LS may be less than the width WSA of the corresponding light-shielding pattern M3S on the low-level surface LS, and the width W5 of the one unit pattern 304A on the high-level surface HS may be less than the width WSB of the corresponding light-shielding pattern M3S on the high-level surface HS, but it is not limited to this. In some embodiments, when the mask M3 is used for the photolithography process, the same exposure conditions can be set to illuminate the high-level surface HS and the low-level surface LS, but the disclosure is not limited to this. The aforementioned width W4 and width W5 can be defined as the maximum width of the central region of the measured component in the first direction X. Under the same exposure conditions, the exposure amount of the low-level surface LS may be lower than the exposure amount of the high-level surface HS, when the photolithography process is performed, the exposure conditions can be adjusted the low-level surface LS subject to sufficient amount of exposure, but the disclosure is not limited to this. In other words, the light-shielding pattern M3S may be designed to have the width WSA less than the width WSB, the width W4 of the unit pattern 304A may be formed by the subsequent photolithography and etching process may be close to or the same as the width W5, but is not limited thereto.

Figure 10:
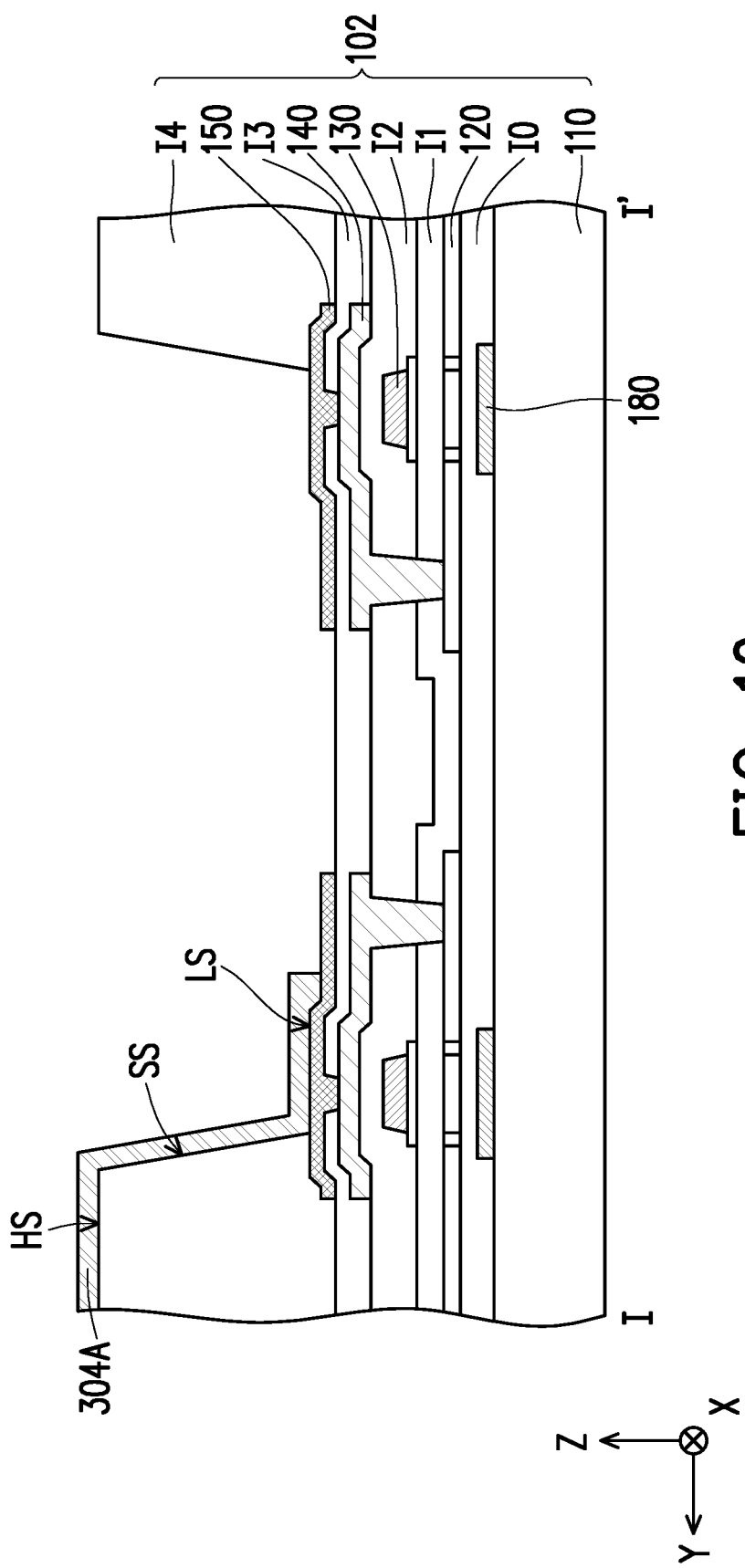
Figure 11:
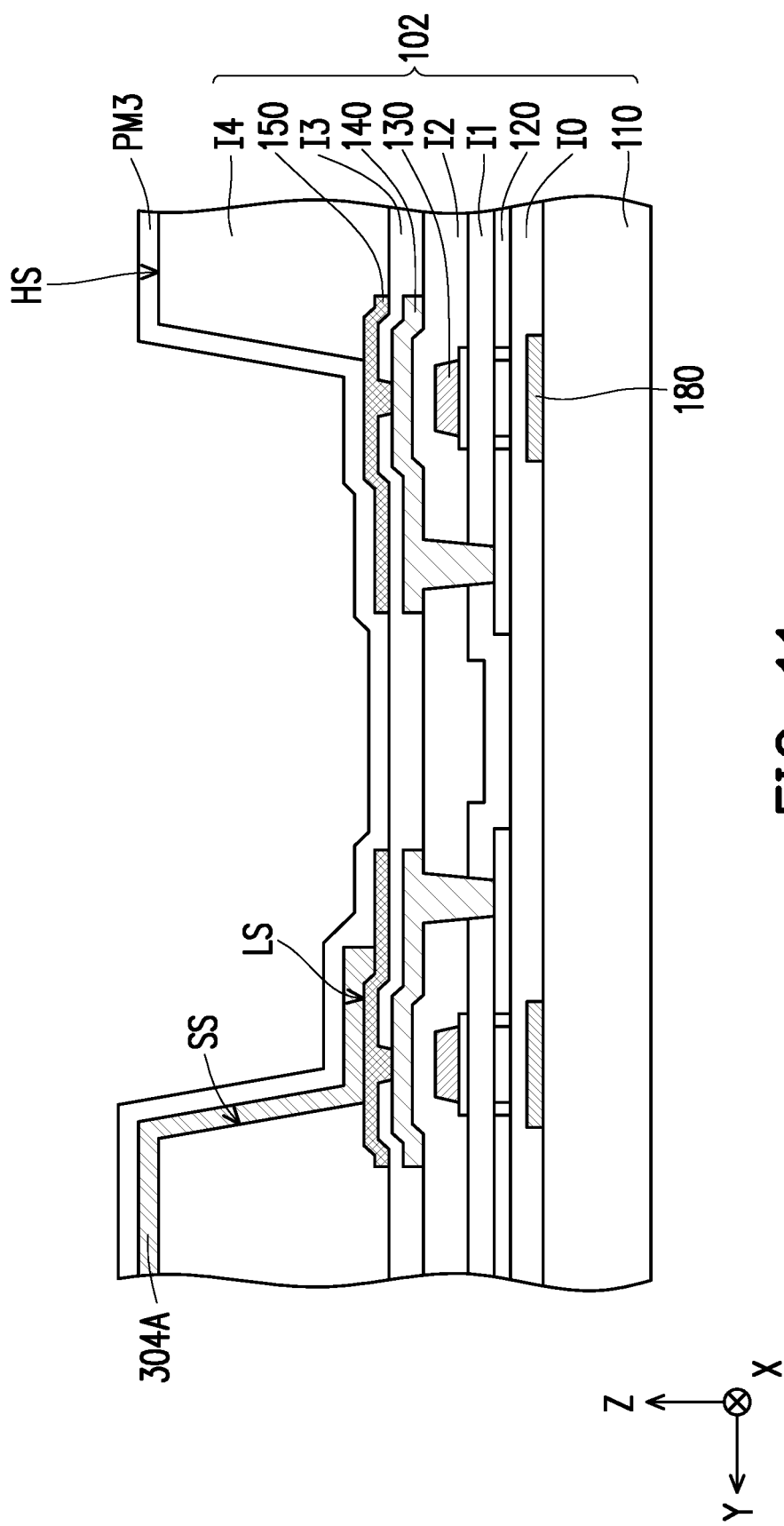

FIG. 10 is a schematic cross-sectional view of the structure of FIG. 9 taken along line I-I'. Please refer to FIG. 9 and FIG. 10 at the same time, the unit pattern 304A may be located at a side of the low-level surface LS, and extends from the low-level surface LS to the taper SS and the high-level surface HS. In addition, as shown in FIG. 10, there is no other unit pattern on the other side of the lower surface LS at this time. In addition, after patterning the pattern material layer PM1 using the photomask M3 as described above to form the unit pattern 304A, an annealing step (not shown) may be performed, and the unit pattern 304A may be denser and not easily removed or damaged in the subsequent steps. Next, as shown in FIG. 11, another deposition process may be performed on the substrate 102 on which the unit pattern 304A has been formed to form another pattern material layer PM3. The pattern material layer PM3 may be provided conformal to the topography of the high-level surface HS, the taper SS and the bottom surface LS and disposed on the unit pattern 304A. In some embodiments, the material of the pattern material layer PM3 may be similar to or the same as the pattern material layer PM1, but is not limited thereto.

Figure 12:
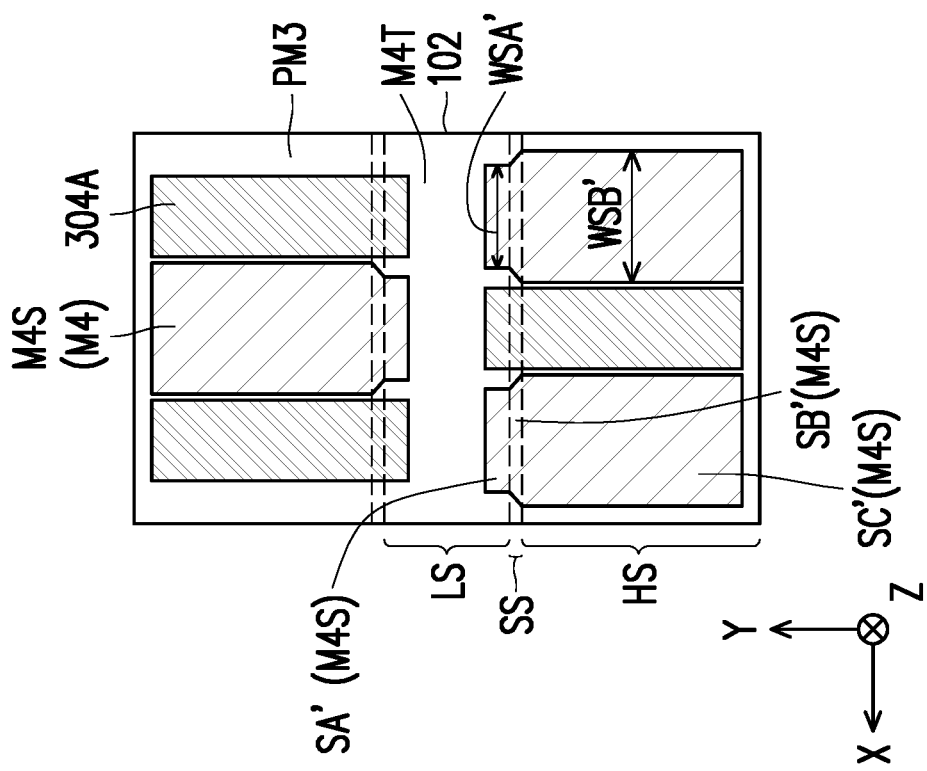

FIG. 12 illustrates a photomask for patterning a pattern material layer placing on a substrate according to an embodiment of the disclosure. Referring to FIG. 12, the photomask M4 is placed on the substrate 102 on which the unit pattern 304A and the pattern material layer PM3 have been formed. In some embodiments, the photomask M4 may have a plurality of light-shielding patterns M4S and a light-transmitting pattern M4T. For example, FIG. 12 illustrates three light-shielding patterns M4S arranged in two rows, but not limited to this. In some embodiments, the light-shielding pattern M4S in the first row (for example, the light-shielding pattern M4S in the upper row) and the light-shielding pattern M4S in the second column (the two light-shielding patterns M4S in the lower row) are alternately arranged with each other in the second direction Y but not aligned with each other. In some embodiments, similar to the aforementioned light pattern M3S, in the normal direction Z of the base 110, the light shielding patterns M4S may overlap the high-level surface HS of the substrate 102, and the light shielding patterns M4S may overlap a part of the substrate low-level surface LS of the substrate 102, but the disclosure is not limited to this. In some embodiments, in the normal direction Z of the base 110, the placement position of the light shielding pattern M4S of the photomask M4 may be substantially between two adjacent unit patterns 304A. In some embodiments, in the normal direction Z of the base 110, the light shielding pattern M4S and the unit pattern 304A may not overlap or slightly overlap. In addition, the outline and/or interval of the light-shielding pattern M4S may be similar to the light-shielding pattern M3S of FIG. 7, but is not limited thereto. In some embodiments, the light-shielding pattern M4S may be similar to the light-shielding pattern M3S. For example, the light-shielding pattern M4S has different widths. The width WSA' of the portion SA' of the light-shielding pattern M4S overlapping the low-level surface LS may be smaller, and the width WSB' of the part SB' of the light-shielding pattern M4S corresponds to or overlapping the high-level surface HS may be larger. In some embodiments, the light shielding pattern M4S may have a portion SC' between the portion SA' and the portion SB', and the width of the portion SC' may be increased from a side connected to the portion SA' to a side connected to the portion SB', but not limited to this. In some embodiments, the portion SC' corresponds to or overlaps with the taper SS', but not limited to this. The above width (including the width WSA' and the width WSB') can be defined as the maximum width of the measured component corresponding to the central region in the first direction X. In some embodiments, the photomask M3 and the photomask M4 may be the same photomask or different photomasks, but when performing the steps of FIG. 12, the position of the photomask used in FIG. 8 can be laterally shifted relative to the position of the photomask used in FIG. 8 to pattern the pattern material layer PM3, but the disclosure is not limited to this.

Figure 13:
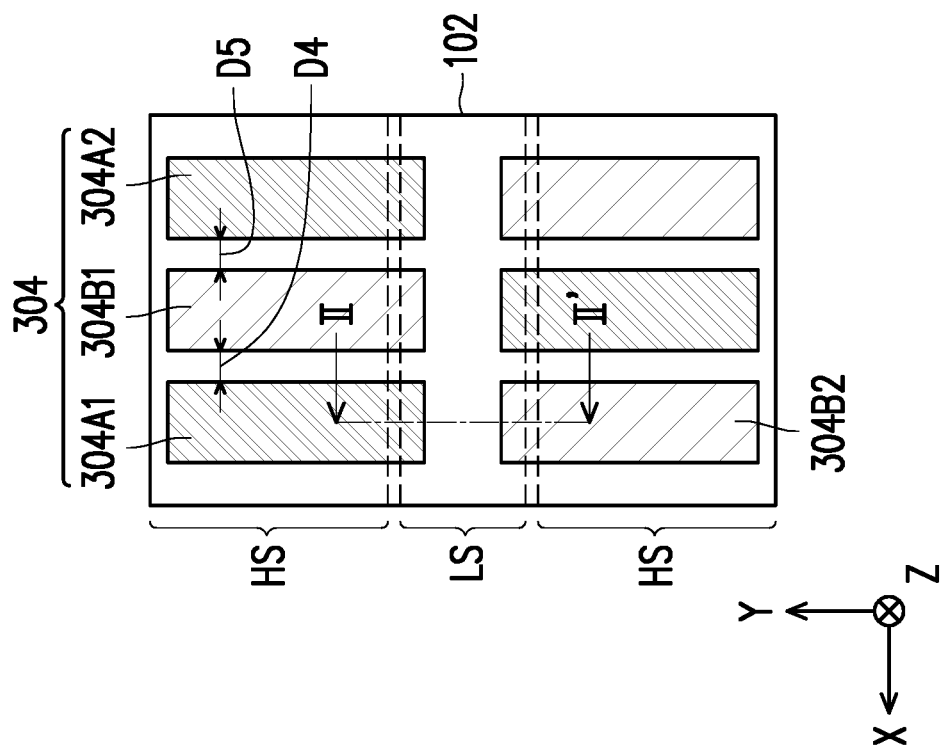

FIG. 13 shows a schematic top view of the unit pattern obtained after patterning the pattern material layer. Referring to FIGS. 12 and 13, the photomask M4 may be used to perform a photolithography process to pattern the pattern material layer PM3 to form a plurality of unit patterns 304B. Here, the step of patterning the pattern material layer PM3 includes a photolithography process and an etching process, which are substantially the same as the steps of FIGS. 8-9, so they are not repeated. The photoresist pattern (not shown) used to etch the pattern material layer PM3 may substantially correspond to the light-shielding pattern M4S, and the unit patterns 304A are not overlapped with the photoresist pattern and are exposed in this step. However, since the unit pattern 304A has been annealed, the chance of the unit pattern 304A being damaged or removed during the patterning of the pattern material layer PM3 can be reduced, the unit pattern 304A can remain on the substrate 102. After the above-mentioned manufacturing process, the unit patterns 304A and the unit patterns 304B may be alternately arranged to form the pattern layer 304.

Figure 14:
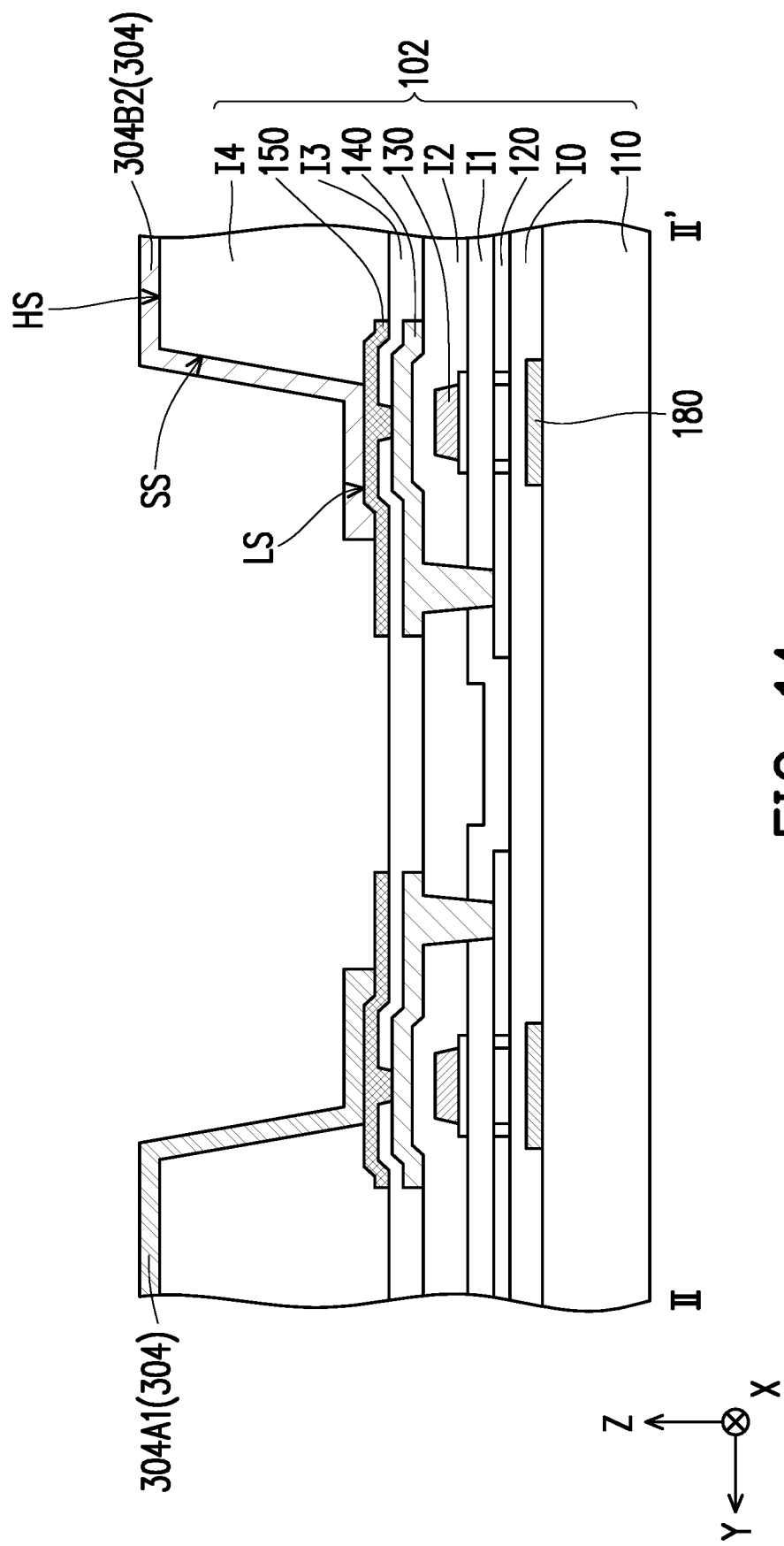

In FIG. 13, the pattern layer 304 includes the first unit pattern 304A1, the second unit pattern 304B1, and the third unit pattern 304A2 sequentially arranged in the first direction X, that is, in the first direction X, the second unit pattern 304B1 is adjacent to the first unit pattern 304A1 and a third unit pattern 304A2 is adjacent to the second unit pattern 304B1, and the second unit pattern 304B1 may be located between the first unit pattern 304A1 and the third unit pattern 304A2. Each of the first unit pattern 304A1, the second unit pattern 304B1, and the third unit pattern 304A2 may extend from the low-level surface LS to the high-level surface HS, but is not limited thereto. In some embodiments, the first unit pattern 304A1 and the third unit pattern 304A2 may be formed by the deposition process shown in FIG. 7, for example, and the second unit pattern 304B1 may be formed by the deposition process shown in FIG. 11, but the disclosure is not limited to this. Therefore, the first unit pattern 304A1 and the second unit pattern 304B1 may be formed by different deposition processes. In addition, the first unit pattern 304A1 and the third unit pattern 304A2 may be formed by the photolithography process shown in FIG. 8, and the second unit pattern 304B1 may be formed by the photolithography process shown in FIG. 11. Therefore, the first unit pattern 304A1 and the second unit pattern 304B1 may be formed by different photolithography processes. As mentioned above, there may be a shift in alignment between the two photolithography processes, the distance D4 between the first unit pattern 304A1 and the second unit pattern 304B1 may be different from the distance D5 between the second unit pattern 304B1 and the third unit pattern 304A2, wherein the distance D4 can be defined as the minimum distance between the first unit pattern 304A1 and the second unit pattern 304B1 in the first direction X, and the distance D5 can be defined as the minimum distance between the second unit pattern 304B1 and the third unit pattern 304A2 in the first direction X. In other embodiments, the distance D4 may be equal to the distance D5. FIG. 14 is a schematic cross-sectional view of the structure of FIG. 13 taken along line II-II". Please refer to FIGS. 13 and 14 at the same time. In the pattern layer 304, the first unit pattern 304A1 may be located on one side of the low-level surface LS, and extends from the low-level surface LS to the taper SS and the high-level surface HS. The fourth unit pattern 304B2 may be located on another side of the low-level surface LS, and extends from the another side of the low-level surface LS to the taper SS and the high-level surface HS, and the fourth unit pattern 304B2 may be opposite to the first unit pattern 304A1. In some embodiments, the pattern layer 304 may serve as a pixel electrode layer.

It should be noted that the above steps of forming the pattern layers in FIGS. 7 to 14 are examples, and the patterns of the photomask M3 and/or the photomask M4 (such as the size, shape, or arrangement position of the shading pattern) are only examples, and can be adjusted according to demand.

Figure 15:
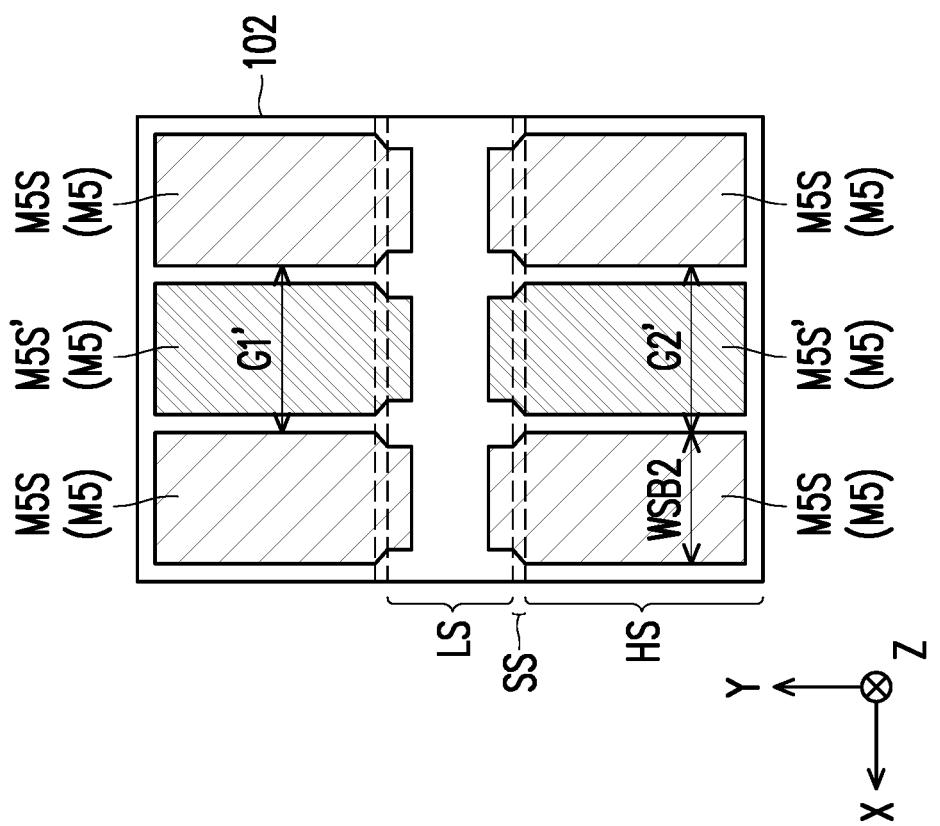
FIG. 15 shows a photomask pattern for patterning a pattern material layer according to another embodiment of the present disclosure.

Please refer to FIG. 15, which shows a photomask pattern for patterning a pattern material layer according to another embodiment of the disclosure. In some embodiments, the photomask M5 may have a plurality of light-shielding patterns M5S and light-transmitting patterns (that is, other parts without the light-shielding pattern M5S), and the photomask M5 of FIG. 15 is described in four light-shielding patterns M5S arranged in two rows, but the disclosure is not limited thereto. It should be noted that although the light-shielding pattern M5S' is shown in FIG. 15, it is mainly used to illustrate the patterning of the pattern material layer in other photolithography processes (to be described later), and illustrates the translation of the photomask M5 corresponding to the light-shielding pattern, there is no light-shielding pattern M5S' between the two light-shielding patterns M5S in the actual mask M5. In some embodiments, the light-shielding patterns M5S in the first row (for example, the left and right shading patterns M5S in the upper row) and the light-shielding patterns M3S in the second row (for example, the left and right shading patterns M5S in the lower row) may be provided on both sides of the low-level surface LS, wherein the light shielding pattern M5S on the left of the first row and the light shielding pattern M5S on the left of the second row may be substantially aligned in the first direction X, and the light shielding pattern M5S on the right of the first row and the light-shielding patterns M5S on the right of the second row are substantially aligned in the first direction X. A gap G1' exists between two adjacent light-shielding patterns M5S in the first row, and a gap G2' exists between two adjacent light-shielding patterns M5S in the second row, and the gap G1' may be substantially the same as the gap G2', but not limited to this. The gag G1' is defined as a minimum distance between two adjacent light-shielding patterns M5S in the first row in the first direction X, and the gap G2' is defined as the minimum distance between two adjacent shading patterns M5S in the second row in the first direction X. In some embodiments, the light-shielding pattern M5S may have a width WSB2 overlapping the portion SB2 of the high-level surface HS. The width WSB2 may be defined as the maximum width of the light-shielding pattern M5S at the central region overlapping the portion SB2 measured in the first direction X. In some embodiments, the gap G1' and the gap G2' may be greater than or equal to the width WSB2, but not limited to this. In some embodiments (not shown), the gap G1' and the gap G2' may be less than or equal to the width WSB2 according to the resolution requirements, as long as the unit patterns formed by the photolithography processes are sufficiently separated from each other to ensure the electrical insulation.

The present disclosure provides another embodiment (not shown) of the steps of manufacturing the pattern layer since the steps of manufacturing the pattern layer are similar to those of FIGS. 7 to 14, reference can be made to FIGS. 7 to 14, and the drawings are not shown in detail. Another embodiment of the step of the manufacturing pattern layer is different from the embodiment of the manufacturing steps of FIGS. 7 to 14 in that the photomask M3 used in FIG. 8 is replaced by the photomask M5 as described in FIG. 15. In detail, a pattern material layer PM1 may be provided on the substrate 102 according to FIG. 7, and then the pattern material layer PM1 may be patterned using a photomask M5 by a photolithography process to pattern the pattern material layer PM1 to form a plurality of unit patterns (not shown, roughly corresponding to the light-shielding pattern M5S shown in FIG. 15), and the size of these unit patterns may be slightly smaller or similar to the corresponding light-shielding pattern M5S. Then, similarly, these unit patterns may be subjected to an annealing step (not shown) to make them denser and not easily removed or damaged in subsequent steps. Next, similar to FIG. 11, on the substrate 102 on which the unit pattern (not shown, which roughly corresponds to the light-shielding pattern M5S in FIG. 15) has been formed, another deposition process is performed to form another pattern material layer PM3. Next, the photomask M5 may be placed in translation, the light-shielding pattern M5S' of the photomask M5 (as corresponding to the light shielding pattern M5S' located in the middle of the first row and the light shielding pattern M5S' corresponding to the middle of the second row in FIG. 15) and the formed unit pattern (not shown, roughly corresponding to the light-shielding pattern M5S in FIG. 15) may be misaligned with and alternately arranged with respect to each other, and a photolithography process is performed to pattern the pattern material layer PM3 to form other unit patterns (not shown, roughly corresponding to the light-shielding pattern M5S' in FIG. 15). Therefore, similarly, a part of the unit patterns and/or other part of the unit patterns may be formed by different deposition processes. In addition, similarly, a part of the unit patterns and other part of the unit patterns may be formed by different photolithography processes.

Figure 16:
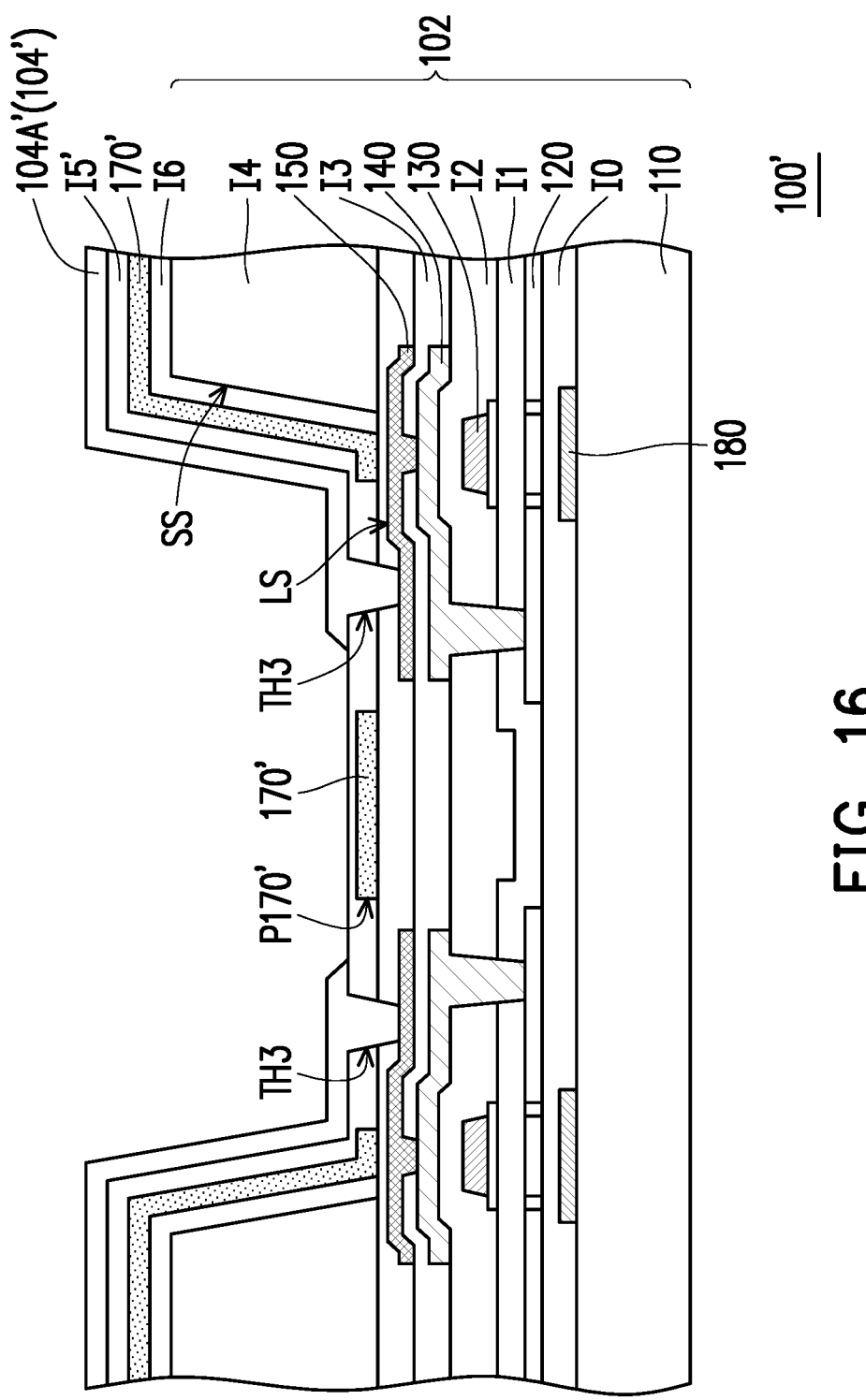
FIG. 16 is a schematic partial cross-sectional view of an electronic device according to an embodiment of the disclosure.

FIG. 16 is a schematic partial cross-sectional view of an electronic device according to an embodiment of the disclosure. The electronic device 100' includes a substrate 102 and a pattern layer 104' including unit patterns 104A' disposed on the substrate 102. The substrate 102 in FIG. 16 is substantially the same as the substrate 102 in FIG. 1, and the structure of the substrate 102 may refer to the related description in FIG. 1 and will not be repeated here. The electronic device 100' further includes a common electrode layer 170', an insulating layer I5' and an insulating layer I6. The insulating layer I6 may be disposed on the third metal layer 150 on the substrate 102, the common electrode layer 170' may be disposed on the insulating layer I6, and the insulating layer I5' may be disposed on the common electrode layer 170', the pattern layer 104' served as the top pixel electrode layer may be placed on the insulating layer I5'. In other words, the common electrode layer 170' is located between the pattern layer 104' and the substrate 102; that is, the electronic device 100' may be designed as a top pixel design. In some embodiments, the common electrode layer 170' may have an opening P170', the pattern layer 104' (e.g., pixel electrode layer) disposed above the common electrode layer 170' may be separated from the common electrode layer 170' and electrically connected to the third metal layer 150. In addition, the insulating layer I5' and the insulating layer I6 form a through hole TH3, the pattern layer 104' can contact or electrically connect the third metal layer 150 through the through hole TH3. In the normal direction Z of the base 110, the through hole TH3 may overlap with the opening P170'. The pattern layer 104' can be manufactured by the aforementioned manufacturing method. In other words, the pattern layer 104' may have the top-view structure of the aforementioned pattern layer 204 or pattern layer 304.

According to the above, the method of manufacturing the electronic device of the disclosed embodiment can make the produced unit patterns have ideal patterns, and gaps between adjacent unit patterns exist to reduce the occurrence of short circuits.

Finally, it should be noted that, each of the above embodiments is used to illustrate the technical solutions of the disclosure, and is not limited thereto. The features of each embodiment may be mixed and used as long as they do not violate the spirit of the disclosure or conflict each other. Although the disclosure has been described in detail with reference to each of the foregoing embodiments, those skilled in the art should understand that the technical solutions recited in each of the foregoing embodiments may still be modified or some or all of the technical features may be equivalently substituted. The modifications and substitutions do not make the essence of the corresponding technical solutions depart from the scope of the technical solutions of each embodiment of the disclosure.

What is claimed is:

1. A method of manufacturing an electronic device, comprising:
   providing a substrate with a step structure, and the step structure comprising a high-level surface and a low-level surface; and forming a pattern layer on the high-level surface and the low-level surface,
wherein the pattern layer is formed by at least two photolithography processes,
and the pattern layer is a pixel electrode layer.

2. The method for manufacturing an electronic device according to claim 1, wherein a material of the pattern layer comprises a transparent conductive material.

3. The method for manufacturing an electronic device according to claim 1, wherein the substrate comprises a base and an insulating layer disposed on the base to form the step structure.

4. The method for manufacturing an electronic device according to claim 1, further comprising an insulating layer disposed on the pattern layer, and a common electrode layer disposed on the insulating layer.

5. The method for manufacturing an electronic device according to claim 1, wherein the pattern layer comprises a first contour at the high-level surface and a second contour at the low-level surface, and the first contour and the second contour are formed by different photolithography processes.

6. The method for manufacturing an electronic device according to claim 5, wherein the first contour is formed by a photolithography process using a first photomask and the second contour is formed by a photolithography process using a second photomask different from the first photomask.

7. The method for manufacturing an electronic device according to claim 1, wherein the step structure further comprises a taper between the high-level surface and the low-level surface, the pattern layer comprises a unit pattern having a first portion on the high-level surface, a second portion on the taper, and a third portion on the low-level surface, and a width of the second portion is less than a width of the first portion.

8. The method of manufacturing an electronic device according to claim 7, wherein the width of the second portion is less than a width of the third portion.

9. The method for manufacturing an electronic device according to claim 7, wherein the first portion is patterned by using a first photomask, and the second portion and the third portion are patterned by using a second mask.

10. The method for manufacturing an electronic device according to claim 1, wherein the pattern layer comprises a first unit pattern and a second unit pattern adjacent to the first unit pattern, each of the first unit pattern and the second unit pattern extends from the low-level surface to the high-level surface, and the first unit pattern and the second unit pattern are formed by different photolithography processes.

11. The method for manufacturing an electronic device according to claim 10, wherein the first unit pattern is formed by a deposition process, and the second unit pattern is formed by another deposition process.

12. The method for manufacturing an electronic device according to claim 10, wherein the pattern layer further comprises a third unit pattern adjacent to the second unit pattern, the second unit pattern is located between the first unit pattern and the third unit pattern, and a distance between the first unit pattern and the second unit pattern is different from a distance between the second unit pattern and the third unit pattern.

13. An electronic device, comprising:
a substrate with a step structure, and the step structure comprising a high-level surface, a low-level surface, and a taper between the high-level surface and the low-level surface;
a unit pattern having a first portion on the high-level surface, a second portion on the taper, and a third portion on the low-level surface;
an insulating layer disposed on the unit pattern; and
a common electrode layer disposed on the insulating layer, wherein the first portion of the unit pattern is disposed between the common electrode layer and the step structure, wherein a width of the second portion is less than a width of the first portion.

14. The electronic device of claim 13, wherein the width of the second portion is less than a width of the third portion.

15. The electronic device according to claim 13, wherein the substrate comprises a base and an insulating layer disposed on the base to form the step structure.

16. The electronic device according to claim 13, wherein the unit pattern is a pixel electrode layer.

17. An electronic device, comprising:
a substrate with a step structure comprising a high-level surface and a low-level surface; and
a pattern layer comprising a first unit pattern, a second unit pattern adjacent to the first unit pattern and a third unit pattern adjacent to the second unit pattern, the second unit pattern being located between the first unit pattern and the third unit pattern, each of the first unit pattern, the second unit pattern, and the third unit pattern extending from the low-level surface to the high-level surface, wherein a distance between the first unit pattern and the second unit pattern is different from a distance between the second unit pattern and the third unit pattern.

18. The electronic device of claim 17, wherein the substrate comprises a base and an insulating layer disposed on the base to form the step structure.

19. The electronic device of claim 7, wherein the pattern layer is a pixel electrode layer.

* * * * *